(12) United States Patent
Morita

(10) Patent No.: US 11,942,761 B2
(45) Date of Patent: Mar. 26, 2024

(54) OPTICAL SEMICONDUCTOR INTEGRATED ELEMENT

(71) Applicant: Mitsubishi Electric Corporation, Tokyo (JP)

(72) Inventor: Yoshimichi Morita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 542 days.

(21) Appl. No.: 17/285,395

(22) PCT Filed: Jan. 9, 2019

(86) PCT No.: PCT/JP2019/000277
§ 371 (c)(1),
(2) Date: Apr. 14, 2021

(87) PCT Pub. No.: WO2020/144752
PCT Pub. Date: Jul. 16, 2020

(65) Prior Publication Data
US 2022/0006262 A1 Jan. 6, 2022

(51) Int. Cl.
*H01S 5/10* (2021.01)
*H01S 5/026* (2006.01)
(Continued)

(52) U.S. Cl.
CPC ............ *H01S 5/1014* (2013.01); *H01S 5/026* (2013.01); *H01S 5/0264* (2013.01); *H01S 5/12* (2013.01); *H01S 5/16* (2013.01)

(58) Field of Classification Search
CPC ......... H01S 5/0264; H01S 5/1014; H01S 5/12
See application file for complete search history.

(56) References Cited

U.S. PATENT DOCUMENTS 4,815,090 A * 3/1989 Usami .................. H01S 5/0264
372/50.21
5,121,182 A 6/1992 Kuroda et al.

FOREIGN PATENT DOCUMENTS

JP S63-222485 A 9/1988
JP H04-134896 A 5/1992
(Continued)

OTHER PUBLICATIONS

An Office Action mailed by China National Intellectual Property Administration dated Jun. 30, 2023, which corresponds to Chinese Patent Application No. 201980077577.3 and is related to U.S. Appl. No. 17/285,395; with English language translation.

(Continued)

*Primary Examiner* — Michael Carter
(74) *Attorney, Agent, or Firm* — Studebaker & Brackett PC

(57) ABSTRACT

Provided here are: a laser diode section provided on a surface of an n-type InP substrate;
a spot-size converter section provided on a surface of the n-type InP substrate, the spot-size converter section being composed of a core layer which causes emitted laser light to propagate therein, a p-type InP cladding layer on a front surface side of the core layer, an n-type InP cladding layer—on a back surface side of the core layer, n-type InP cladding layers provided on the both sides of the core layer, and a p-type InP cladding layer provided on respective surfaces of the p-type InP cladding layer and the first cladding layers; a window region provided on a surface of the n-type InP substrate—that is placed on a front-end side of the core layer; and a monitor PD as a monitor section provided on a surface of the window region.

19 Claims, 11 Drawing Sheets

(51) Int. Cl.
*H01S 5/12* (2021.01)
*H01S 5/16* (2006.01)

(56) References Cited

FOREIGN PATENT DOCUMENTS

| | | |
|---|---|---|
| JP | H04-211209 A | 8/1992 |
| JP | 2000-036638 A | 2/2000 |
| JP | 2000-114642 A | 4/2000 |
| JP | 2000-269587 A | 9/2000 |
| JP | 2002-116333 A | 4/2002 |
| JP | 2008-066406 A | 3/2008 |
| JP | 2012-069799 A | 4/2012 |
| JP | 2012-118402 A | 6/2012 |
| JP | 2016-096310 A | 5/2016 |
| KR | 10-2001-0028259 A | 4/2001 |

OTHER PUBLICATIONS

An Office Action; "Notice of Reasons for Refusal", mailed by the Japanese Patent Office dated Dec. 14, 2021, which corresponds to Japanese Patent Application No. 2020-565059 and is related to U.S. Appl. No. 17/285,395; with English language translation.
International Search Report issued in PCT/JP2019/000277; dated Apr. 9, 2019.

* cited by examiner

OPTICAL SEMICONDUCTOR INTEGRATED ELEMENT

TECHNICAL FIELD

The present application relates to an optical semiconductor integrated element.

BACKGROUND ART

In order to reduce the number of components of a communication device, such structures have long been proposed in which a monitor Photo Diode (hereinafter, abbreviated to as a "monitor PD") is integrated in a semiconductor laser chip (see, for example, Patent Document 1). Meanwhile, in order to improve a coupling efficiency with an optical fiber, spot-size convertors have long been proposed which serve for enlarging a small beam-spot diameter provided by a semiconductor laser (see, for example, Patent Document 2).

CITATION LIST

Patent Document

Patent Document 1: Japanese Patent Application Laid-open No. S63-222485 (Page 3, Upper-Right Column, Line 14 to Lower-Right Column, Line 13; FIG. 4)
Patent Document 2: Japanese Patent Application Laid-open No. 2000-036638 (Paragraphs 0023 to 0043; FIG. 1)

SUMMARY OF THE INVENTION

Problems to be Solved by the Invention

In the case where the spot-size converter as shown in Patent Document 2 is applied to the semiconductor laser of Patent Document 1, since the spot-size converter that is designed to enlarge the beam-spot diameter is usually narrow in radiation angle of emitted light, there is a problem that it is not possible to cause a sufficient amount of light to enter the monitor PD placed on the upper side of a window region.

This application discloses a technique for solving the problem as described above, and an object thereof is to provide an optical semiconductor integrated element which, even with a structure in which the window region is disposed on the light emission side of the spot-size converter, can cause a sufficient amount of light to enter the monitor PD.

Means for Solving the Problems

An optical semiconductor integrated element disclosed in this application is characterized by comprising: a laser diode section provided on a surface of a substrate; a spot-size converter section provided on a surface of the substrate, said spot-size converter section being composed of a core layer which causes laser light emitted from the laser diode section to propagate therein and whose both sides are tapered down in a propagation direction of the laser light to form a tapered shape, a front-surface side cladding layer which covers a front surface side of the core layer, a back-surface side cladding layer which covers a back surface side of the core layer, first cladding layers provided on the both sides of the core layer; and a second cladding layer provided on respective surfaces of the front-surface side cladding layer and the first cladding layers; a window region provided on a surface of the substrate that is placed on a front-end side of the core layer of the spot-size converter section; and a monitor section provided on a surface of the window region; wherein a refractive index of the first cladding layers is lower than a refractive index of the second cladding layer.

Further, an optical semiconductor integrated element disclosed in this application is characterized by comprising: a laser diode section provided on a surface of a substrate; a spot-size converter section provided on a surface of the substrate, said spot-size converter section being composed of a core layer which causes laser light emitted from the laser diode section to propagate therein and whose both sides are tapered down in a propagation direction of the laser light to form a tapered shape, a front-surface side cladding layer which covers a front surface side of the core layer, a back-surface side cladding layer which covers a back surface side of the core layer, first cladding layers provided on the both sides of the core layer, and a second cladding layer provided on respective surfaces of the front-surface side cladding layer and the first cladding layers; a window region provided on a surface of the substrate that is placed on a front-end side of the core layer of the spot-size converter section, said window region having a first window layer provided as a portion of that region corresponding to the first cladding layers and a second window layer provided as a portion of that region corresponding to the second cladding layer; and a monitor section provided on a surface of the window region; wherein a refractive index of the first window layer is lower than a refractive index of the second window layer.

Effect of the Invention

According to this application, the refractive index of the first cladding layers is set lower than the refractive index of the second cladding layer, so that it is possible to deviate the laser light bled from the core layer toward the monitor PD 50, to thereby cause a sufficient amount of light to enter the monitor PD.

MODES FOR CARRYING OUT THE INVENTION

Embodiment 1

Figure 1:
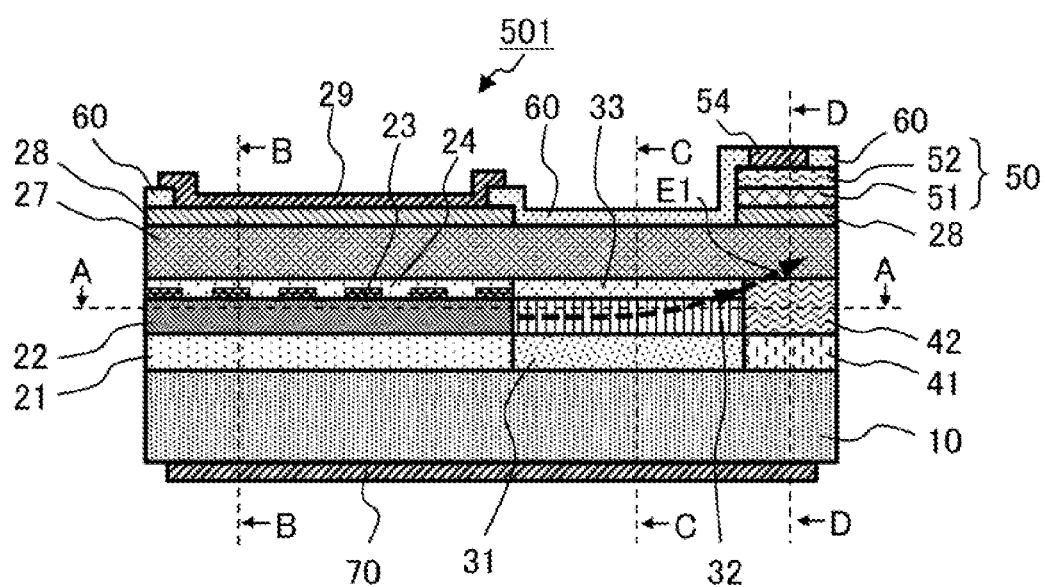
FIG. 1 is a sectional side view showing a configuration of an optical semiconductor integrated element according to Embodiment 1.
Figure 2:
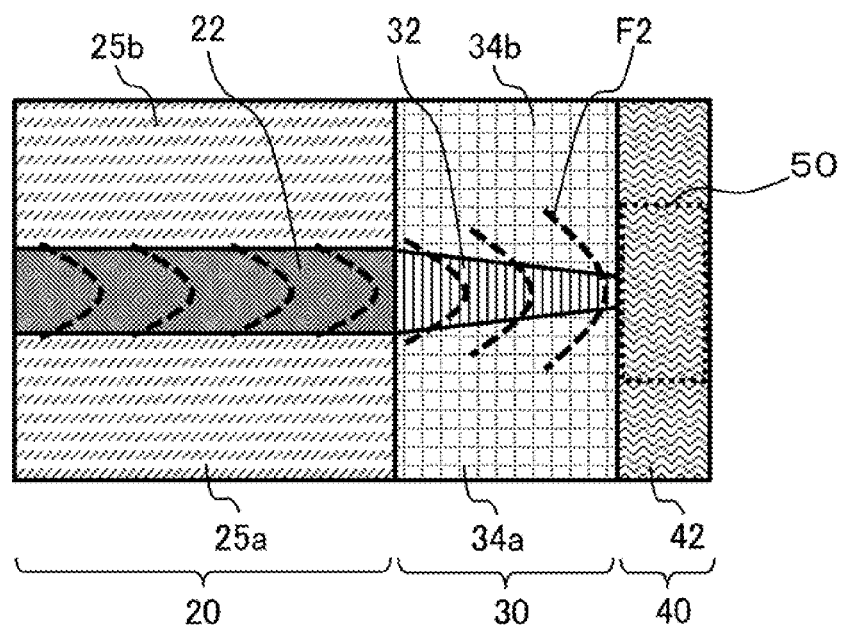
FIG. 2 is a transverse sectional view along A-A in FIG. 1, showing a configuration of the optical semiconductor integrated element according to Embodiment 1.
Figure 3:
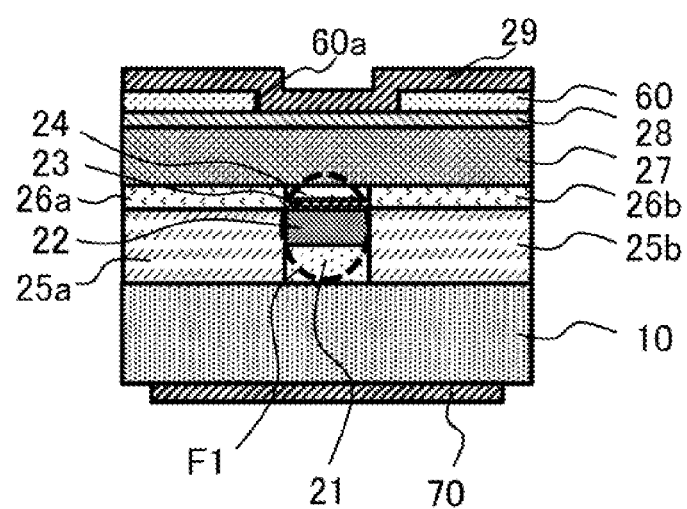
FIG. 3 is a vertical sectional view along B-B in FIG. 1, showing a configuration of the optical semiconductor integrated element according to Embodiment 1.
Figure 4:
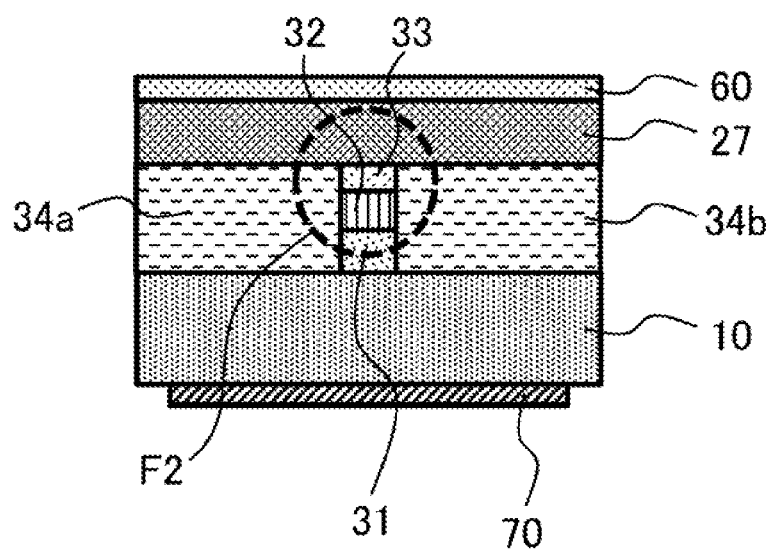
FIG. 4 is a vertical sectional view along C-C in FIG. 1, showing a configuration of the optical semiconductor integrated element according to Embodiment 1.
Figure 5:
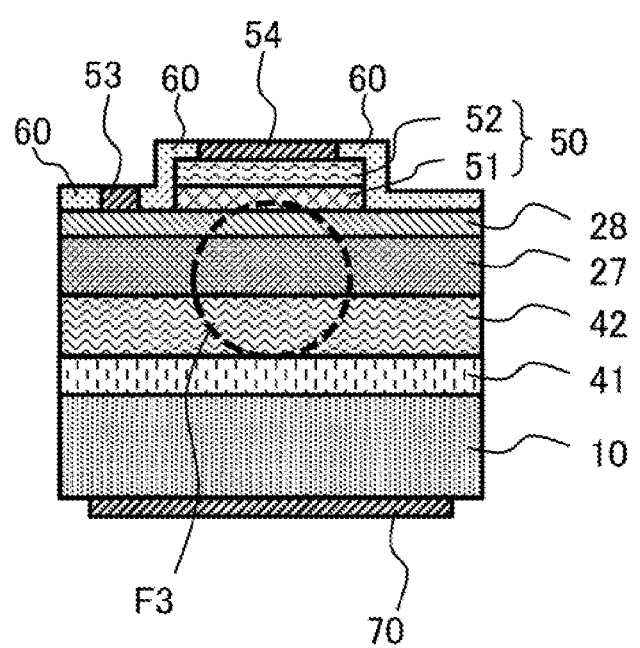
FIG. 5 is a vertical sectional view along D-D in FIG. 1, showing a configuration of the optical semiconductor integrated element according to Embodiment 1.
Figure 6:
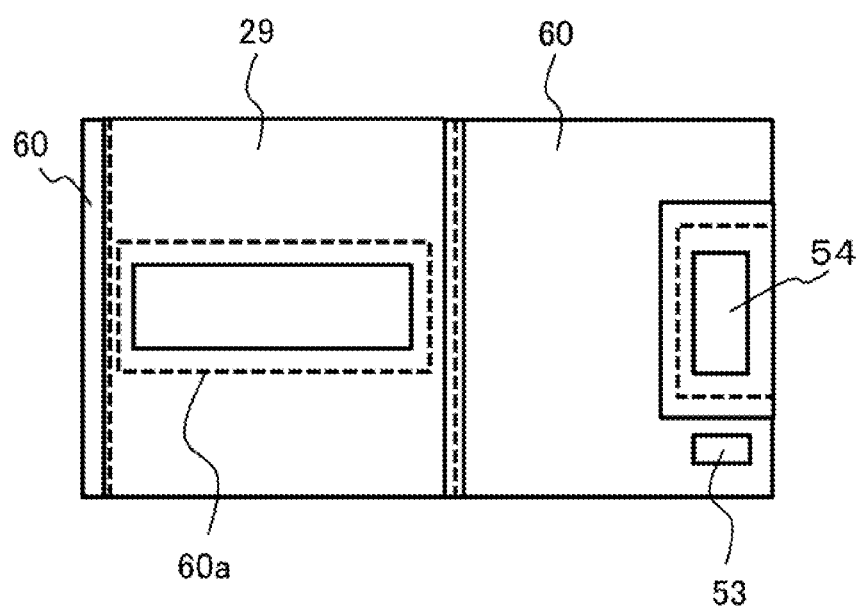
FIG. 6 is a top view showing a configuration of the optical semiconductor integrated element according to Embodiment 1.

FIG. 1 is a sectional view showing a configuration of an optical semiconductor integrated element according to Embodiment 1, which is a longitudinal sectional view taken through a central portion thereof in the direction of laser emission. FIG. 2 is a transverse sectional view of the optical semiconductor integrated element taken at a position indicated by arrows AA in FIG. 1. FIG. 3 is a vertical sectional view of the optical semiconductor integrated element taken at a position indicated by arrows BB in FIG. 1. FIG. 4 is a vertical sectional view of the optical semiconductor integrated element taken at a position indicated by arrows CC in FIG. 1. FIG. 5 is a vertical sectional view of the optical semiconductor integrated element taken at a position indicated by arrows DD in FIG. 1. FIG. 6 is a top view of FIG. 1.

As shown in FIG. 1 to FIG. 6, an optical semiconductor integrated element 501 of Embodiment 1 is configured with a laser diode section 20, a spot-size converter section 30, a window region 40 and a monitor PD 50 provided on a surface of the window region 40.

The laser diode section 20 is a distributed feedback laser, in which an n-type InP cladding layer for vertical confinement, a core layer 22, a diffraction grating 23 and a p-type InP cladding layer 24 for vertical confinement are stacked in this order on a surface of an n-type InP substrate 10, and these layers are patterned into a stripe shape. The respective both sides of the n-type InP cladding layer and the core layer 22 are buried by p-type InP cladding layers 25a, 25b for lateral confinement whose bandgap energy is larger than that of the core layer 22. Further, the respective both sides of the diffraction grating 23 and the p-type InP cladding layer 24 are buried by n-type InP cladding layers 26a, 26b for lateral confinement whose bandgap energy is larger than that of the core layer 22. Furthermore, a p-type InP cladding layer 27 and a p-type contact layer 28 are stacked in this order on the surfaces of the p-type InP cladding layer 24 and the n-type cladding layers 26a, 26b. The surface of the p-type contact layer 28 is protected by a passivation film 60, and a p-electrode 29 is connected through an opening 60a created in the passivation film 60 to the p-type contact layer 28. An n-electrode 70 is connected to the under surface of the n-type InP substrate 10.

The spot-size converter section 30 is a buried-type spot-size converter having a function of enlarging a beam-spot diameter, located on the emission side of the laser diode section 20. A core layer 32 in the spot-size converter section 30 is a waveguide that is connected to the core layer 22 in the laser diode section 20 and that is tapered down in the propagation direction of laser light incident from the core layer 22 to form a tapered shape. In the spot-size converter section 30, an n-type InP cladding layer 31 for vertical confinement, the core layer 32 and a p-type InP cladding layer 33 for vertical confinement are stacked in this order on a surface of the n-type InP substrate 10, and these layers are patterned so that their respective both sides are tapered down in the propagation direction of the laser light, to form a tapered shape.

In the spot-size converter section 30, the core layer 32 is so configured that its upper and lower sides are covered with the p-type InP cladding layer 33 as a front-surface side cladding layer and the n-type InP cladding layer 31 as a back-surface side cladding layer, respectively, and its left and right sides are covered with n-type cladding layers 34a, 34b as first cladding layers, respectively. The respective both sides of the n-type InP cladding layer 31, the core layer 32 and the p-type InP cladding layer 33 are buried by the n-type InP cladding layers 34a, 34b as the first cladding layers for lateral confinement. The p-type InP cladding layer 27 common with the laser diode section 20 is stacked as a second cladding layer on the surfaces of the p-type InP cladding layer 33 and the n-type cladding layers 34a, 34b. The surface of the p-type InP cladding layer 27 is fully protected by the passivation film 60.

The n-type InP cladding layer 31 in the spot-size converter section 30 corresponds to the n-type InP cladding layer 21 in the laser diode section 20. The p-type InP cladding layer 33 corresponds to the diffraction grating 23 and the p-type InP cladding layer in the laser diode section 20. The n-type InP cladding layers 34a, 34b correspond to the p-type InP layers 25a, 25b and the n-type InP cladding layers 26a, 26b in the laser diode section 20.

Here, it is well known that, due to the free-carrier plasma effect, the n-type InP cladding layers 34a, 34b become lower in refractive index than the p-type InP cladding layer 27, so that the refractive index of the n-type InP cladding layers 34a, 34b is set lower than the refractive index of the p-type InP cladding layer 27. Note that, in this Embodiment, a vertical refractive-index distribution is defined by the combination of the p-type InP cladding layer 27 and the n-type InP cladding layers 34a, 34b; however, this is not limitative. A layer other than that of InP may instead be used. Further, these layers may each be a combination of multiple layers so that the refractive-index distribution is established stepwise.

The window region 40 is made up of a semiconductor material that is transparent to the light incident from the spot-size converter section 30, and has an end-face window structure with no waveguide mechanism.

An n-type InP layer 41 and an undoped InP layer 42 as a first window layer are stacked in this order on a surface of the n-type InP substrate 10. The p-type InP cladding layer 27 as a second window layer and the p-type contact layer 28, that are common with the laser diode section 20, are stacked in this order on the surface of the undoped InP layer 42. Here, undoped InP is employed for the purpose of reducing the optical absorption loss in the window region 40.

The n-type InP layer 41 in the window region 40 corresponds to the n-type InP cladding layer 31 and lower portions of the n-type InP cladding layers 34a, 34b in the spot-size converter section 30. The undoped InP layer 42 corresponds to the core layer 32, the p-type InP cladding layer 33 and upper portions of the n-type InP cladding layers 34a, 34b in the spot-size converter section 30.

The monitor PD 50 is a PIN-type photodiode. The monitor PD 50 is formed of an undoped InP layer 51 and an n-type contact layer 52 that are stacked in this order on a surface of the p-type contact layer 28 in the window region 40. The surface of the n-type contact layer 52 is protected by the passivation film 60, and a p-electrode 53 and an n-electrode 54 are connected through openings 60b, 60c to the p-type contact layer 28 and the n-type contact layer 52, respectively.

Figure 7:
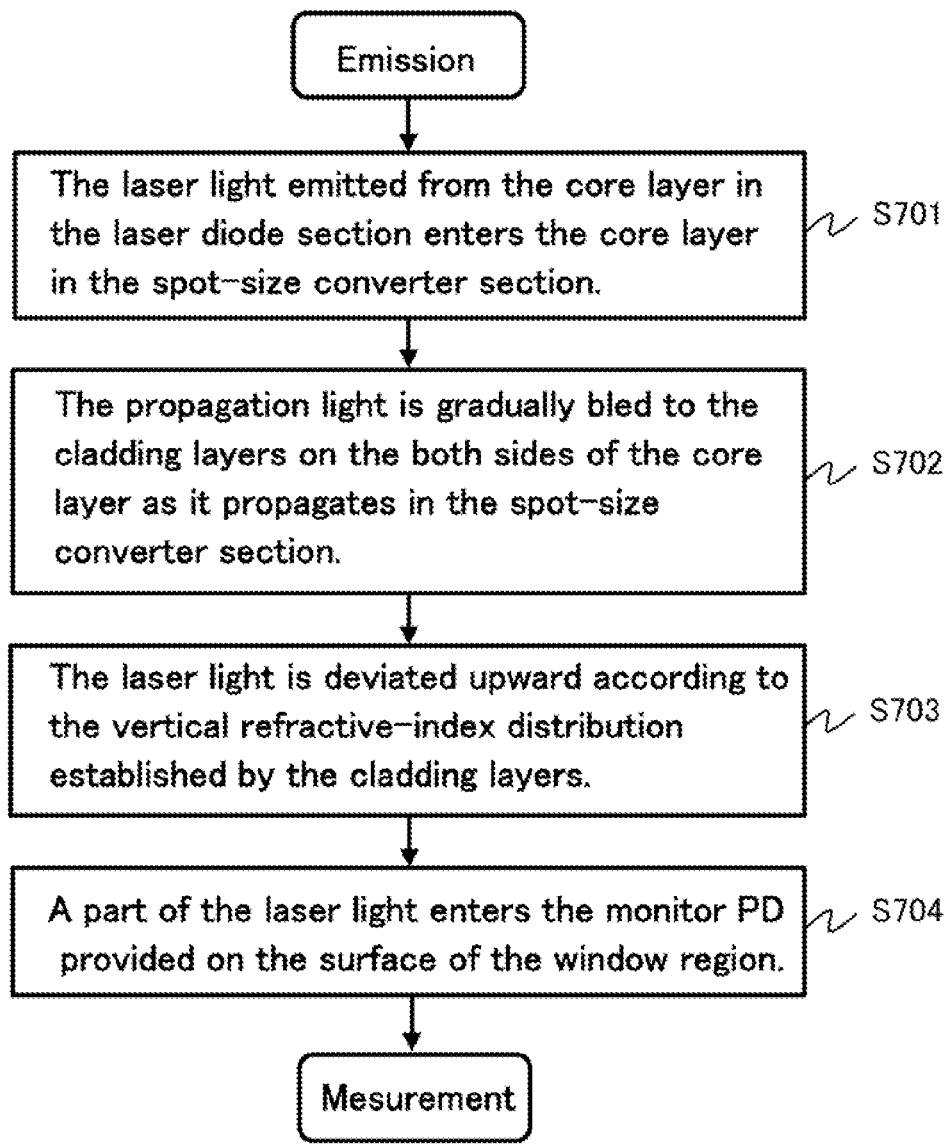
FIG. 7 is a flowchart for explaining operations of the optical semiconductor integrated element according to Embodiment 1.

Next, operations of the optical semiconductor integrated element 501 according to Embodiment 1 will be described. FIG. 7 is a flowchart for explaining operations in the spot-size converter section 30 of the optical semiconductor integrated element 501 according to Embodiment 1.

First, in the spot-size converter section 30, the laser light emitted from the core layer 22 in the laser diode section 20 enters the core layer 32 in the spot-size converter section 30 (Step S701). Subsequently, because in the spot-size converter section 30, the core layer 32 is patterned so that its both sides are tapered down in the propagation direction of the laser light, to form a tapered shape, the propagation light is gradually bled to the n-type InP cladding layers 34a, 34b on the both sides of the core layer 32 as it propagates in the spot-size converter section 30 (Step S702). In FIG. 2, wavelike dotted lines F2 show how the laser light is bled in the traveling direction (light intensity distribution), so that we can see how the propagation light is gradually bled to the n-type InP cladding layers 34a, 34b on the both sides of the core layer 32.

Then, in the spot-size converter section 30, the laser light bled from the core layer 32 is deviated upward according to the vertical refractive-index distribution established by the n-type InP cladding layers 34a, 34b on the both sides of the core layer 32 and the p-type InP cladding layer 27 on the upper side of the core layer 32 and the n-type InP cladding layers 34a, 34b (Step S703; see, an optical path E2 in FIG. 1). In FIG. 3 and FIG. 4, elliptic dotted lines F1, F2 show the ranges of the laser light around the core layers 22, 23, respectively. It is found that, as compared with the range of the laser light shown by the elliptic dotted line F1, the range of the laser light shown by the elliptic dotted line F2 is not only spread out to the n-type InP cladding layers 34a, 34b on the both sides of the core layer 32, but also is deviated toward the upper-side P-type InP cladding layer 27 because of the vertical refractive-index distribution established by the n-type InP cladding layers 34a, 34b and the p-type InP cladding layer 27.

Lastly, the spot-size converter section 30 radiates the upwardly-deviated laser light to the window region 40, so that a part of the laser light enters the monitor PD 50 provided on the surface of the window region 40 (Step S704). In FIG. 5, it is found that a part of the range of the laser light shown by an elliptic dotted line F3 comes into the monitor PD 50. To the monitor PD 50 is applied a reverse bias voltage through the p-electrode 53 and the n-electrode 54, so that laser light absorbed in the p-type contact layer 28 is photoelectrically converted and then taken as a monitor current into an external circuit.

In this manner, in the spot-size converter section 30, the core layer 32 is patterned so that its both sides are tapered down in the propagation direction of the laser light, to form a tapered shape, and the refractive index of the n-type InP cladding layers 34a, 34b on the both sides of the core layer is set lower than the refractive index of the p-type InP cladding layer 27 that is placed on the side near the monitor PD 50 and covers the front surface side of the core layer, so that it is possible to deviate the laser light bled from the core layer toward the monitor PD 50, to thereby cause a sufficient amount of light to enter the monitor PD.

As described above, the optical semiconductor integrated element 501 according to Embodiment 1 comprises: the laser diode section 20 provided on a surface of the n-type InP substrate 10; the spot-size converter section 30 provided on a surface of the n-type InP substrate 10, said spot-size converter section being composed of the core layer 32 which causes laser light emitted from the laser diode section 20 to propagate therein and whose both sides are tapered down in the propagation direction of the laser light to form a tapered shape, the p-type InP cladding layer 33 as a front-surface side cladding layer which covers the front surface side of the core layer 32, the n-type InP cladding layer 31 as a back-surface side cladding layer which covers the back surface side of the core layer 32, the n-type InP cladding layers 34a, 34b as first cladding layers provided on the both sides of the core layer 32, and the p-type InP cladding layer 27 as a second cladding layer provided on the respective surfaces of the front-surface side cladding layer and the first cladding layers; the window region 40 provided on a surface of the n-type InP substrate 10 that is placed on the front-end side of the core layer 32 of the spot-size converter section 30; and the monitor PD 50 as a monitor section provided on a surface of the window region 40; wherein the refractive index of the first cladding layers is lower than the refractive index of the second cladding layer. Thus, it is possible to deviate the laser light bled from the core layer toward the monitor PD 50, to thereby cause a sufficient amount of light to enter the monitor PD.

It is noted that in this Embodiment, although the spot-size converter section 30 is located adjacent to the laser diode section 20, even in such a structure in which a waveguide-type device such as a modulator or the like is integrated in between these sections, an effect similar to the above will be achieved.

Embodiment 2

In Embodiment 1, in the window region 40, the undoped InP layer 42 is provided as a portion of that region corresponding to the core layer 32, the p-type InP cladding layer 33 and the upper portions of the n-type InP cladding layers 34a, 34b in the spot-size converter section 30; whereas, in Embodiment 2, an n-type InP layer is provided as the portion of that region.

Figure 8:
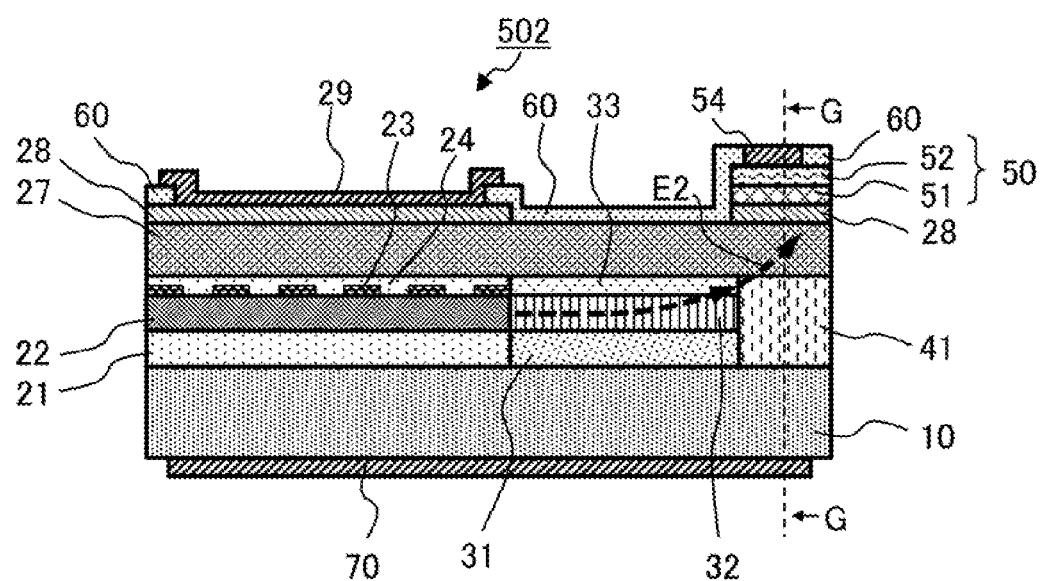
FIG. 8 is a sectional side view showing a configuration of an optical semiconductor integrated element according to Embodiment 2.
Figure 9:
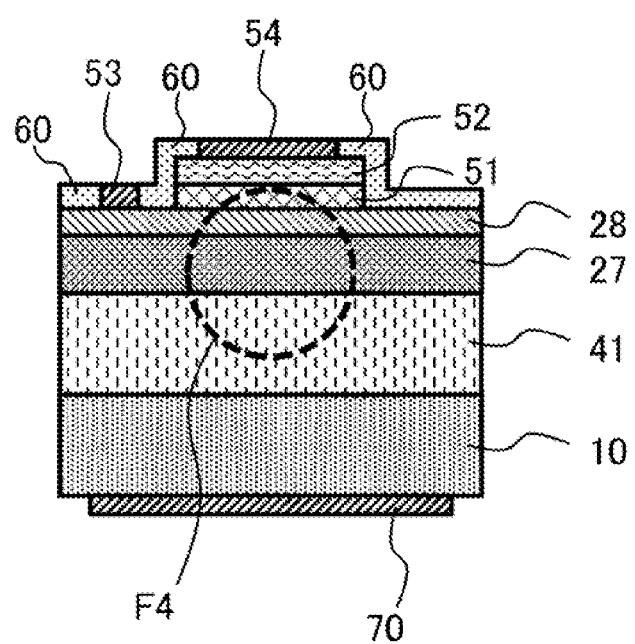
FIG. 9 is a vertical sectional view along G-G in FIG. 8, showing a configuration of the optical semiconductor integrated element according to Embodiment 2.

FIG. 8 is a sectional view showing a configuration of an optical semiconductor integrated element according to Embodiment 2, which is a longitudinal sectional view taken through a central portion thereof in the direction of laser emission. FIG. 9 is a vertical sectional view of the optical semiconductor integrated element taken at a position indicated by arrows GG in FIG. 8.

As shown in FIG. 8 and FIG. 9, in an optical semiconductor integrated element 502 of Embodiment 2, an n-type InP layer 41 which is also a common layer with the n-type InP cladding layers 34a, 34b as the first cladding layers, is employed instead of the portion of the region as the undoped InP layer 42 in Embodiment 1. The other configuration of the optical semiconductor integrated element 502 according to Embodiment 2 is the same as in the optical semiconductor integrated element 501 of Embodiment 1 and thus, for the equivalent components, the same reference numerals are given, so that description thereof will be omitted.

In Embodiment 2, the propagation light emitted from the laser diode section 20 enters the window region 40, in a state being deviated upward by the spot-size converter section 30. In Embodiment 1, since the p-type InP cladding layer 27 and the undoped InP layer 42 both have a refractive index of 3.204 (in the case where the wavelength is 1.3 μm) with no difference, the light having entered the window region 40 travels straightforward. In contrast, in Embodiment 2, the refractive index of the n-type InP layer 41 as the first window layer located at the exit port of the spot-size converter section 30 is 3.19 (in the case where the wavelength is 1.3 μm and the carrier concentration is $5 \times 10^{18}$ cm$^{-3}$; the refractive index becomes lower as the carrier concentration becomes higher), and is thus lower than that of the p-type InP cladding layer 27 as the second window layer.

Accordingly, the light having entered the window region is deviated upward to more extent according the difference between the above refractive indexes (see, an optical path E2 in FIG. 8, and a range of the laser light: an elliptic dotted line F4, in FIG. 9). Thus, as compared with Embodiment 1, it is possible to further increase the amount of light entering the monitor PD 50.

As described above, in the optical semiconductor integrated element 502 according to Embodiment 2, the n-type InP layer 41 as the first window layer is provided as a portion of the window region 40 corresponding to the n-type InP cladding layers 34a, 34b as the first cladding layers; the p-type InP cladding layer 27 as the second window layer is provided as a portion of the window region 40 corresponding to and in common with the p-type cladding layer 27 as the second cladding layer; and the refractive index of the first window layer is set lower than the refractive index of the second window layer. Thus, the light having entered the window region is deviated upward to more extent according to the difference between these refractive indexes, so that, as compared with Embodiment 1, it is possible to further increase the amount of light entering the monitor PD.

It is noted that in Embodiment 2, in addition to a configuration in which the refractive index of the first cladding layer is set lower than the refractive index of the second cladding layer, such a configuration is employed in which the refractive index of the first window layer is also set lower than the refractive index of the second window layer; however, an effect will be produced merely by the configuration in which the refractive index of the first window layer is set lower than the refractive index of the second window layer. Combining these configurations makes it possible to enjoy both effects thereby.

Embodiment 3

In Embodiment 1, the monitor PD 50 is provided only on the surface of the window region 40, whereas in Embodiment 3, a case will be described where the monitor PD is not only placed on the surface of the window region 40 but also is extended onto a surface of the spot-size converter section 30.

Figure 10:
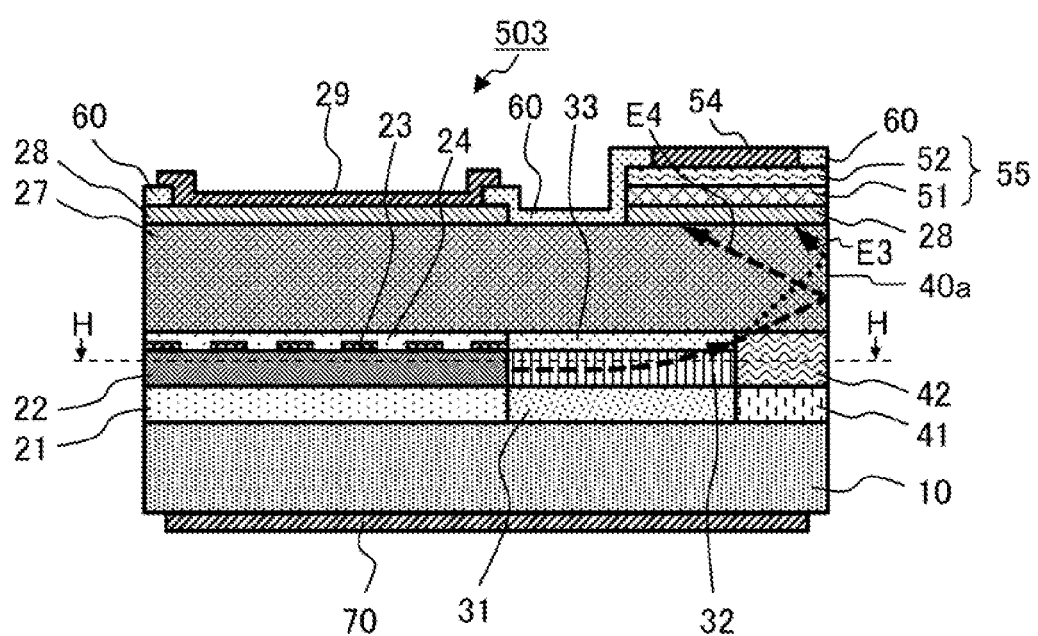
FIG. 10 is a sectional side view showing a configuration of an optical semiconductor integrated element according to Embodiment 3.
Figure 11:
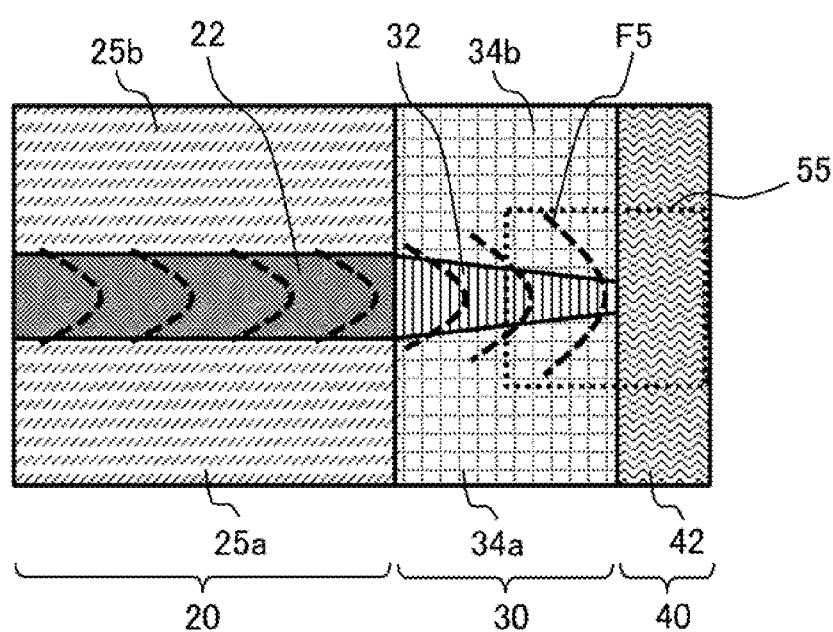
FIG. 11 is a sectional side view along H-H in FIG. 10, showing a configuration of the optical semiconductor integrated element according to Embodiment 3.

FIG. 10 is a sectional view showing a configuration of an optical semiconductor integrated element according to Embodiment 3, which is a longitudinal sectional view taken through a central portion thereof in the direction of laser emission. FIG. 11 is a transverse sectional view of the optical semiconductor integrated element taken at a position indicated by arrows HH in FIG. 10.

As shown in FIG. 10 and FIG. 11, in an optical semiconductor integrated element 503 of Embodiment 3, a monitor PD 55 results from extension of the monitor PD in Embodiment 1 and is provided so as to extend across between the surface of the window region 40 and a part of the surface of the spot-size converter section 30. The monitor PD 55 of Embodiment 3 is formed of the p-type contact layer 28, the undoped InP layer 51 and the n-type contact layer 52 that are stacked in this order so as to extend across between the p-type InP cladding layer 27 in the spot-size converter section 30 and the p-type InP cladding layer 27 in the window region 40 on their upper side. The other configuration of the optical semiconductor integrated element 503 according to Embodiment 3 is the same as in the optical semiconductor integrated element 501 of Embodiment 1 and thus, for the equivalent components, the same reference numerals are given, so that description thereof will be omitted.

In Embodiment 3, reflection light from a front-end facet 40a of the window region 40 is effectively utilized. Although a part of the reflection light from the front-end facet 40a (see, an optical path E3 in FIG. 10) enters a portion of the window region 40 corresponding to the monitor PD 55, the amount of light entering the monitor PD 55 is restricted because the window length is usually short (if it is long, radiation light in the window region may be reflected off the passivation film on the surface of the element, to deform an FFP (Far Field Pattern) shape).

In contrast, according to Embodiment 3, the monitor PD 55 exists also on the surface of the spot-size converter section 30 located before the window region 40, so that the amount of light entering the monitor PD 55 increases (see, an optical path E4 in FIG. 10).

As described above, in the optical semiconductor integrated element 503 according to Embodiment 3, the monitor PD 55 is provided so as to extend across between the surface of the window region 40 and the surface of the spot-size converter section 30, so that, as compared with Embodiment 1, it is possible to further increase the amount of light entering the monitor PD.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS and SIGNS

10: n-type InP substrate, 20: laser diode section, 22: core layer, 27: p-type InP cladding layer (second cladding layer), 30: spot-size converter section, 34a, 34b: n-type InP cladding layers (first cladding layers), 40: window region, 50, 55: monitor PD (monitor section), 501, 502, 503: optical semiconductor integrated element.

The invention claimed is:

1. An optical semiconductor integrated element, comprising:
a laser diode section provided on a surface of a substrate;
a spot-size converter section provided on a surface of the substrate, said spot-size converter section being composed of: a core layer which causes laser light emitted from the laser diode section to propagate therein and whose both sides are tapered down in a propagation direction of the laser light to form a tapered shape; a front-surface side cladding layer which covers a front surface side of the core layer; a back-surface side cladding layer which covers a back surface side of the core layer; first cladding layers provided on the both sides of the core layer; and a second cladding layer provided on respective surfaces of the front-surface side cladding layer and the first cladding layers;

a window region provided on a surface of the substrate that is placed on a front-end side of the core layer of the spot-size converter section; and a monitor section provided on a surface of the window region;

wherein a refractive index of the first cladding layers is lower than a refractive index of the second cladding layer.

2. The optical semiconductor integrated element according to claim 1, wherein each of the first cladding layers and the second cladding layer is composed of multiple layers, and the refractive index in these layers decreases stepwise from a side of the first cladding layers to a side of the second cladding layer.

3. The optical semiconductor integrated element according to claim 2, wherein a first window layer is provided as a portion of the window region corresponding to the first cladding layers, and a second window layer is provided as a portion of the window region corresponding to the second window layer; and wherein a refractive index of the first window layer is lower than a refractive index of the second window layer.

4. The optical semiconductor integrated element according to claim 3, wherein the first window layer is an n-type InP layer and the second window layer is a p-type InP layer.

5. The optical semiconductor integrated element according to claim 4, wherein the monitor section is provided so as to extend across to a surface of the spot-size converter section.

6. The optical semiconductor integrated element according to claim 3, wherein the monitor section is provided so as to extend across to a surface of the spot-size converter section.

7. The optical semiconductor integrated element according to claim 2, wherein the monitor section is provided so as to extend across to a surface of the spot-size converter section.

8. The optical semiconductor integrated element according to claim 1, wherein the first cladding layers are n-type InP layers and the second cladding layer is a p-type InP layer.

9. The optical semiconductor integrated element according to claim 8, wherein a first window layer is provided as a portion of the window region corresponding to the first cladding layers, and a second window layer is provided as a portion of the window region corresponding to the second window layer; and wherein a refractive index of the first window layer is lower than a refractive index of the second window layer.

10. The optical semiconductor integrated element according to claim 9, wherein the first window layer is an n-type InP layer and the second window layer is a p-type InP layer.

11. The optical semiconductor integrated element according to claim 10, wherein the monitor section is provided so as to extend across to a surface of the spot-size converter section.

12. The optical semiconductor integrated element according to claim 9, wherein the monitor section is provided so as to extend across to a surface of the spot-size converter section.

13. The optical semiconductor integrated element according to claim 8, wherein the monitor section is provided so as to extend across to a surface of the spot-size converter section.

14. The optical semiconductor integrated element according to claim 1, wherein a first window layer is provided as a portion of the window region corresponding to the first cladding layers, and a second window layer is provided as a portion of the window region corresponding to the second window layer; and wherein a refractive index of the first window layer is lower than a refractive index of the second window layer.

15. The optical semiconductor integrated element according to claim 14, wherein the first window layer is an n-type InP layer and the second window layer is a p-type InP layer.

16. The optical semiconductor integrated element according to claim 15, wherein the monitor section is provided so as to extend across to a surface of the spot-size converter section.

17. The optical semiconductor integrated element according to claim 14, wherein the monitor section is provided so as to extend across to a surface of the spot-size converter section.

18. The optical semiconductor integrated element according to claim 1, wherein the monitor section is provided so as to extend across to a surface of the spot-size converter section.

19. An optical semiconductor integrated element, comprising:

a laser diode section provided on a surface of a substrate;

a spot-size converter section provided on a surface of the substrate, said spot-size converter section being composed of: a core layer which causes laser light emitted from the laser diode section to propagate therein and whose both sides are tapered down in a propagation direction of the laser light to form a tapered shape; a front-surface side cladding layer which covers a front surface side of the core layer; a back-surface side cladding layer which covers a back surface side of the core layer; first cladding layers provided on the both sides of the core layer; and a second cladding layer provided on respective surfaces of the front-surface side cladding layer and the first cladding layers;

a window region provided on a surface of the substrate that is placed on a front-end side of the core layer of the spot-size converter section, said window region having a first window layer provided as a portion of that region corresponding to the first cladding layers and a second window layer provided as a portion of that region corresponding to the second cladding layer; and a monitor section provided on a surface of the window region;

wherein a refractive index of the first window layer is lower than a refractive index of the second window layer.

* * * * *